(12) United States Patent
Ikehara

(10) Patent No.: US 7,195,998 B2
(45) Date of Patent: Mar. 27, 2007

(54) COMPOUND SEMICONDUCTOR DEVICE AND MANUFACTURING METHOD THEREOF

(75) Inventor: Masahiro Ikehara, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/341,697

(22) Filed: Jan. 13, 2003

(65) Prior Publication Data

US 2003/0134494 A1 Jul. 17, 2003

(30) Foreign Application Priority Data

Jan. 16, 2002 (JP) ............... 2002-007556
Oct. 1, 2002 (JP) ............... 2002-288975

(51) Int. Cl.
*H01L 21/20* (2006.01)
(52) U.S. Cl. ......................... 438/584; 438/39
(58) Field of Classification Search .................. 438/33, 438/39, 150, 164, 343, 705, 733, 748, 749, 438/750, 584; 257/466, 586, 623, 628, 95, 257/750

See application file for complete search history.

(56) References Cited

U.S. PATENT DOCUMENTS

| | | | | |
|---|---|---|---|---|
| 4,028,140 A | * | 6/1977 | Summers et al. | ............ 438/531 |
| 4,956,844 A | * | 9/1990 | Goodhue et al. | ....... 372/44.011 |
| 5,356,823 A | * | 10/1994 | Mitani | ......... 438/180 |
| 5,723,360 A | * | 3/1998 | Iwasaki | ........ 438/41 |
| 5,786,234 A | * | 7/1998 | Nagai et al. | .......... 438/47 |
| 5,948,573 A | * | 9/1999 | Takahashi | .......... 430/5 |
| 6,515,309 B1 | * | 2/2003 | Tohyama et al. | ........... 257/88 |
| 6,517,734 B1 | * | 2/2003 | Muller et al. | .......... 216/24 |
| 6,569,604 B1 | * | 5/2003 | Bhatt et al. | .......... 430/311 |
| 6,724,068 B2 | * | 4/2004 | Matsuyama | .......... 257/618 |

FOREIGN PATENT DOCUMENTS

| | | |
|---|---|---|
| JP | 62-16583 | 1/1987 |
| JP | 03-190287 | 8/1991 |
| JP | 07-335989 A | 12/1995 |
| JP | 08-064864 | 3/1996 |
| JP | 10-335696 | 12/1998 |
| JP | 2001-284650 A | 10/2001 |

* cited by examiner

*Primary Examiner*—Roy Potter
(74) *Attorney, Agent, or Firm*—Morrison & Foerster LLP

(57) ABSTRACT

A compound semiconductor device including: an isolated mesa section on which an upper surface having two pairs of parallel sides is formed by mesa etching a compound semiconductor wafer, wherein the mesa section is formed from at least a forward mesa surface which is a mesa section side surface having an obtuse angle against a wafer surface and a backward mesa surface which is a mesa section side surface having an acute angle against the wafer surface, the two mesa surfaces being recognized when viewed from an X direction parallel to one pair of the two parallel sides of the upper surface of the mesa section.

11 Claims, 5 Drawing Sheets p-AlGaAs
p-AlInP
n-AlGaInP
n-AlInP
n-GaAs

COMPOUND SEMICONDUCTOR DEVICE AND MANUFACTURING METHOD THEREOF

BACKGROUND OF THE INVENTION

1. Field of the Invention

The present invention relates to a compound semiconductor device and a manufacturing method thereof. More specifically, the present invention relates to a compound semiconductor device having a mesa section formed by etching a compound semiconductor wafer, and a manufacturing method of such a compound semiconductor device.

2. Description of the Related Art

As conventional light emitting diode arrays each of which is manufactured on the basis of this compound semiconductor device and used in a data pack for printing a date in a camera, there have been known those described in, for example, Patent Literatures 1 to 4.

Patent Literature 1

Japanese Unexamined Patent Publication No. SHO 62(1987)-16583 (pages 2 to 4, FIGS. 1 to 4)

Patent Literature 2

Japanese Unexamined Patent Publication No. HEI10 (1998)-335696 (pages 2 to 5, FIGS. 1 and 2)

Patent Literature 3

Japanese Unexamined Patent Publication No. HEI 3(1991)-190287 (pages 2 to 3, FIGS. 1 to 4)

Patent Literature 4

Japanese Unexamined Patent Publication No. HEI 8(1996)-64864 (pages 2 to 8, FIGS. 1 to 19)

According to the conventional art, when a semiconductor wafer having, for example, a Zinc Blend structure is obtained by liquid phase or vapor phase epitaxial growth, a substrate having a surface orientation in the vicinity of {100} is generally employed as a substrate for the epitaxial growth.

In the semiconductor wafer having the Zinc Blend structure, a {111} A surface and a {111} B surface greatly differ in etching rate due to the excess or deficiency of dangling bond. Therefore, in a case of obtaining a mesa shape by etching, when an etching rate is low, anisotropic etching is performed and a forward mesa surface and a backward mesa surface consequently appear. That is, a mesa surface in a forward direction (a mesa section side surface at an obtuse angle against a wafer surface from a direction parallel to a pair of two sides in a compound semiconductor device having the mesa section and obtained by subjecting a compound semiconductor wafer to a mesa etching and by isolating elements on two pairs of parallel sides) and a mesa surface in a backward direction (a mesa section side surface at an acute angle against the wafer surface) appear.

However, when the wafer having the mesa section thus formed on the surfaces is cut and isolated into a plurality of elements by means of dicing, the respective elements are often damaged by a coolant which cools a dicing blade. In other words, since the coolant is collided against the wafer surface at high speed by the dicing blade which rotates at high speed, the mesa section on the wafer surface is damaged, depending on the shape of the wafer surface against which the coolant is collided or the direction in which the coolant is collided against the wafer surface.

For example, when a thin film such as an electrode is formed on the mesa section, the thin film is often peeled off by collision pressure generated by the blade cooling coolant. To be specific, the conventional art has the following disadvantage. If the thin film (f) is formed on the mesa section on the surface of the wafer (w) as shown in FIG. 1 and the dicing blade (b1) rotates clockwise (cw), the thin film (f) tends to be peeled off on a part β. If the dicing blade (b1) rotates counterclockwise (ccw), the thin film (f) tends to be peeled off on a part α.

Even when no film is formed on the mesa section, crystals themselves are sometimes damaged by the collision pressure generated by the coolant. To be specific, the conventional art has the following disadvantage. If no film is formed on the mesa section on the surface of the wafer (w) as shown in FIG. 2 and the blade (b1) rotates clockwise (cw), a part δ tends to be damaged. If the blade (b1) rotates counterclockwise (ccw), a part γ tends to be damaged.

As can be seen, whether a film is formed on the mesa section or not, the peel-off or damage can be prevented to some extent by decreasing the quantity of the coolant or decelerating the rotational speed of the blade. However, these measures are not substantial solutions to these disadvantages. Further, if the measures are taken, not only the processing capability of a dicing machine deteriorates but also the rotational speed of the blade is decreased. As a result, a new defect resulting from cutting such as chipping may possibly occur.

Furthermore, even when a film is formed on the mesa section and the film is bonded to the mesa section strongly enough, a deformation such as the bending of the film may possibly occur. Besides, in an element inversion process for inverting the elements from one adhesive sheet, to which the wafer is fixed during the dicing process, onto another adhesive sheet, which process is performed after the element isolation by means of dicing, the film is sometimes peeled off on the upper portion of the mesa section or crystals are damaged on the lower portion of the mesa part at a location at which stress concentration on an acute part occurs.

SUMMARY OF THE INVENTION

The present invention has been made in view of these circumstances. It is an object of the present invention to provide a compound semiconductor device capable of preventing a plurality of elements obtained by cutting and isolating a wafer, on the surface of which a mesa section is formed, from being damaged by coolant and capable of preventing the respective elements from being damaged in an adhesive sheet inversion process after element isolation by means of dicing, and a producing method thereof.

According to one aspect of the present invention, there is provided a compound semiconductor device including an isolated mesa section on which an upper surface having two pairs of parallel sides is formed by mesa etching a compound semiconductor wafer, wherein the mesa section is formed from at least a forward mesa surface which is a mesa section side surface having an obtuse angle against a wafer surface, and a backward mesa surface which is a mesa section side surface having an acute angle against the wafer surface, the two mesa surfaces being recognized when viewed from an X direction parallel to one pair of the two parallel sides of the upper surface of the mesa section.

According to the present invention, the semiconductor wafer has a mesa shape having the forward mesa surfaces and the backward mesa surfaces in both of the two dicing directions, a coolant is allowed to be bring into contact with the mesa section side surfaces only from the direction in which the elements are not damaged, and operations can be performed in the direction in the adhesive sheet inversion process

DESCRIPTION OF THE PREFERRED EMBODIMENT

Herein, the mesa section may be formed from a forward mesa surface which is a mesa section side surface having the obtuse angle against the wafer surface and a backward mesa surface which is a mesa section side surface having the acute angle against the wafer surface, the two mesa surfaces being recognized if viewed from a Y direction parallel to the other pair of the two parallel sides of the upper surface of the mesa section.

The compound semiconductor device constituted as described above functions in a dicing process as follows.

When a film is formed on the mesa section, the overhung quantity of the film above the backward mesa surface is small and the angle between the film and the backward mesa surface is obtuse. Due to this, the force of the coolant for peeling off the film on the backward mesa surface during the dicing is lower than that on the forward mesa surface.

When no film is formed on the mesa section, the forward mesa surface forms an acute angle against the wafer surface. Due to this, the force of the coolant for isolating the wafer from the mesa section on the forward mesa surface during the dicing is lower than that on the backward mesa surface.

The compound semiconductor device constituted as described above functions in an adhesive sheet inversion process as follows.

Figure 7:
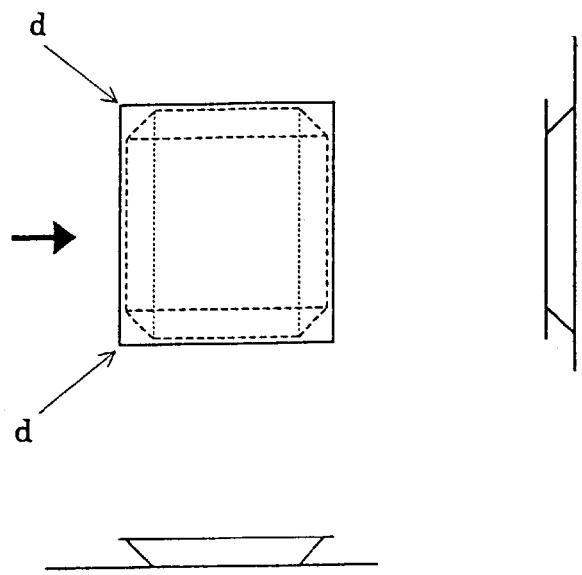
FIG. 7 illustrates a state where a forward mesa surface section is damaged when a conventional element is peeled from a backward mesa surface.

When a film is formed on the mesa section and the elements are peeled from the corner part of the mesa section in which the two backward mesa surfaces intersect each other (to direction c shown in FIG. 5), the peel-off direction coincides with the extension direction of the corner part in which the two backward mesa surfaces intersect each other. Due to this, even when the elements are peeled from the conventional forward mesa surfaces, no damage is imposed on the elements on the backward mesa surfaces (position d in FIG. 7).

When no film is formed on the mesa section and the elements are peeled only from the corner part of the mesa section in which the two forward mesa surfaces intersect each other, the peel-off direction coincides with the extension direction of the corner part in which the two forward mesa surfaces intersect each other. Due to this, even when the elements are peeled from the conventional forward mesa surfaces, no damage is imposed on the elements on the backward mesa surfaces.

In summary, according to the present invention, the semiconductor wafer has a mesa shape (see FIGS. 3 and 4) having the forward mesa surfaces and the backward mesa surfaces in both of the two dicing directions, the coolant is allowed to be bring into contact with the mesa section side surfaces only from the direction in which the elements are not damaged (a in FIG. 3 and b in FIG. 4), and operations can be performed in the direction (c in FIG. 5) in the adhesive sheet inversion process.

According to another aspect of the present invention, there is provided a manufacturing method a compound semiconductor device for obtaining the compound semiconductor device according to claim 1, a wafer has a wafer surface substantially parallel to a {100} surface, and the mesa section is patterned by mesa etching with at least one of the X and Y directions set substantially parallel to a <100> direction.

Figure 6:
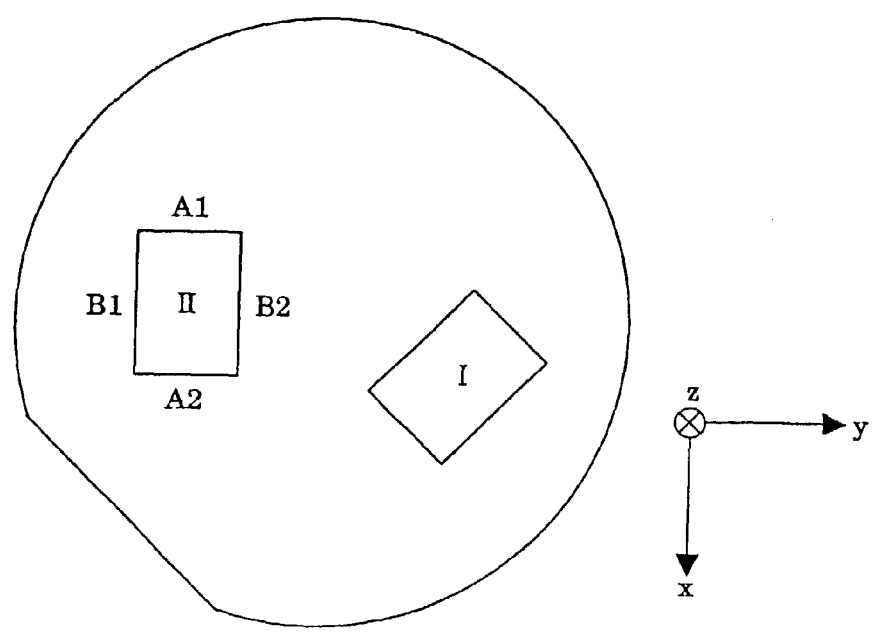
FIG. 6 illustrates a patterning method so that sides of a rectangular chip are oriented in specific directions according to the conventional art and according to the present invention.

To form a mesa section having forward mesa surfaces and backward mesa surfaces in both of the two dicing directions, the wafer substantially parallel to the {100} surface is patterned so that the sides of the rectangular chip shown in FIG. 6 is substantially in the <100> direction and <010> direction according to the present invention (II in FIG. 6) while such a wafer is normally patterned so that the sides of the rectangular chip is substantially in the <110> direction and <1-10> direction (I in FIG. 6)

If the element isolation direction is set so that at least one of the X and Y directions is substantially parallel to the <100> direction, it is preferable that the mesa etching is wet etching performed at an etching rate of not more than 10 μm/min. This is because when wet etching is performed at an etching rate in such a range, it is possible to obtain desired forward mesa surfaces and backward mesa surfaces.

Further, as for etchant for obtaining the above-described etching rate, when the wafer having the AlGaAs layer and/or the AlInP layer is to be employed, it is preferable that phosphoric acid based etchant or sulfuric acid based etchant is employed so as to obtain the desired forward mesa surfaces and backward mesa surfaces. As the phosphoric acid based etchant, it is preferable to employ hot phosphoric acid at a temperature of 70±20° C. As the sulfuric acid based etchant, it is preferable to employ a mixture of sulfuric acid, a hydrogen peroxide solution and water with the volume of the sulfuric acid being one to four times as large as the total volume of the hydrogen peroxide solution and the water.

In order to obtain the desired forward mesa surfaces and backward mesa surfaces by the above-described patterning according to the present invention, it is preferable that the semiconductor wafer has a Zinc Blend structure, a wafer surface orientation is displaced from the {100} surface by 5 to 25°, and that a displacement direction is offset from both the <100> direction and the <010> direction by not less than 30°.

That is, in case of the Just {001} surface of the Zinc Blend structure, the forward mesa surfaces and the backward mesa surfaces do not appear at desired positions only by setting the dicing lines in the <100> direction and the <010> direction, respectively. Whether each of the four side surfaces of the mesa section of the device becomes a forward mesa surface or a backward mesa surface will be described. In FIG. 6, on the edge A1, the {111} forward mesa surface and {1-11} backward mesa surface appear. On the edge A2, the {-1-11} forward mesa surface and {-111} backward mesa surface appear. On the edge B1, the {-1-11} forward mesa surface and {1-11} backward mesa surface appear. On the edge B2, the {111} forward mesa surface and {-111} backward mesa surface appear. That is, the side surfaces on which the forward mesa surfaces cross each other or the backward mesa surfaces intersect each other cannot be stably obtained.

According to the present invention, by displacing the wafer surface orientation by a predetermined angle and offsetting the displacement direction by a predetermined angle in the semiconductor wafer having the Zinc Blend structure, it is possible to obtain the desired forward mesa surfaces and backward mesa surfaces.

Further, according to the present invention, it is preferable that the method further includes a step of isolating the semiconductor device by means of dicing, the dicing is performed using a dicing blade while coolant is being supplied, and that the coolant is accelerated in both the X and Y directions so that the coolant is brought into contact with the mesa section side surfaces only from sides of the forward mesa surfaces or only from sides of backward mesa surfaces. This is because the coolant is brought into contact with the mesa section side surfaces from the direction in which the elements are not damaged.

Moreover, according to the present invention, it is preferable that the dicing is performed while the semiconductor wafer is bonded to one adhesive sheet, the method includes a step of, after the dicing, inverting the semiconductor device bonded to the one adhesive sheet to a different adhesive sheet, and that in inversion process, the semiconductor device is peeled off and inverted onto the different adhesive sheet only from a corner part in which the two backward mesa surfaces of the mesa section intersect each other or a corner part in which the two forward mesa surfaces intersect each other. This is because operations can be performed in the direction in which the elements are less damaged even in the adhesive sheet inversion process and damage imposed on the elements can be thereby avoided.

Hereinafter, one embodiment according to the present invention will be described with reference to the drawings. It is noted that the present invention is not limited by this embodiment.

As one embodiment according to the present invention, a case where a metallic thin film (electrode) is provided on a mesa section will be described while taking a semiconductor wafer having a Zinc Blend structure as an example.

Figure 8:
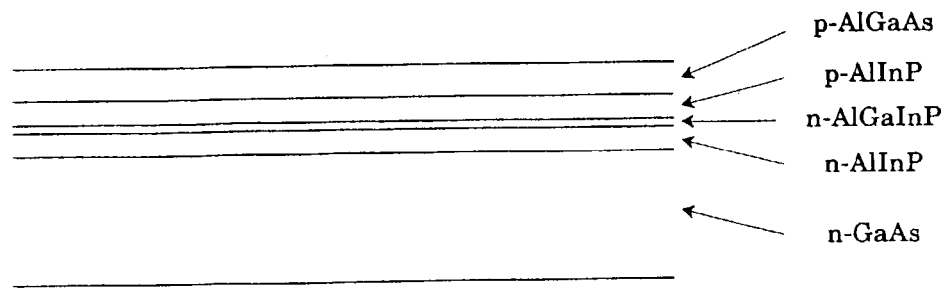
FIG. 8 is a cross-sectional view of the semiconductor wafer according to the present invention.

FIG. 8 is a cross-sectional view of a semiconductor wafer. A P-electrode and N-electrode are formed on the both surfaces of this wafer, respectively. Depending on the material of the electrodes or the contents of heat treatment, the N-electrode may be formed after selective etching is performed to P-type layers.

Figure 9:
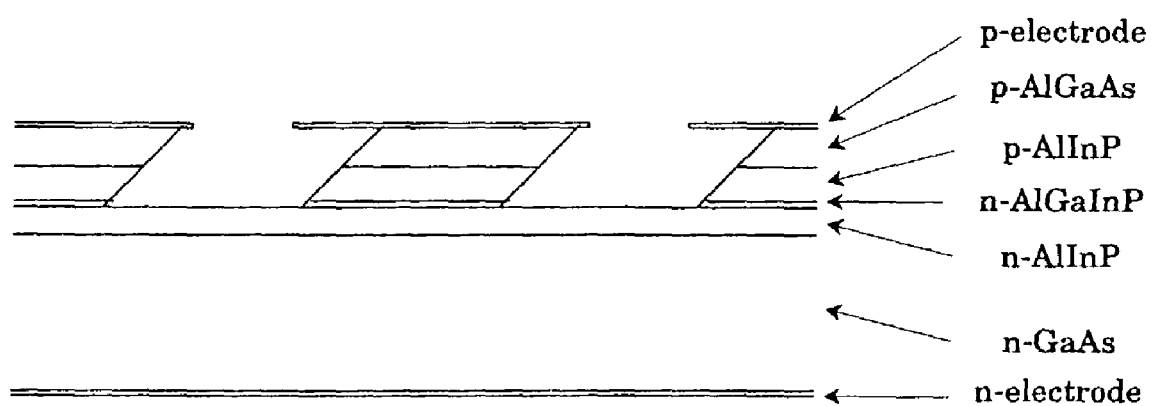
FIG. 9 is a cross-sectional view of the compound semiconductor device according to the present invention.

After forming the P-electrode, the P-type layers of the wafer are partially etched away by wet etching and a plurality of P-type sections are formed in one element, whereby a monolithic light emitting diode having a plurality of light emitting segments in one element can be manufactured as shown in FIG. 9.

As the surface orientation of the wafer, a surface obtained by rotating a {001} surface by 25° with <110> direction as a rotational axis, is employed.

Generally, the Miller index is a directional vector in a three-dimensional space in the case of the orientation, and is a normal vector in the three-dimensional space in the case of the surface. The angle formed between these vectors is obtained by the following expression.

When the angle formed between a vector a and a vector b is θ, the following expression is satisfied:

$$\cos \theta = (a, b)/|a| \cdot |b|$$

As for surfaces A1, A2, B1 and B2, among forward mesa surfaces and backward mesa surfaces which appear most frequently, the surface having narrow angles against the respective four side surfaces, the surface parallel to the side surfaces appears preferentially. Therefore, the surface A1 is a forward mesa surface, A2 is a backward mesa surface, B1 is a backward mesa surface and B2 is a forward mesa surface. The forward mesa surfaces intersect each other in the corner of the surfaces A1 and B2, and backward mesa surfaces intersect each other in the corner of the surfaces A2 and B1.

The surface orientation of the wafer is thus selected, the wafer is patterned, and a region of the patterned wafer which is not to be etched in a photoetching process is protected by a photoresist. Thereafter, the p-AlGaAs layer is etched with a mixture of sulfuric acid:hydrogen peroxide solution:water=8:1:1 used as sulfuric acid based etchant. The p-AlInP layer is etched with hot phosphoric acid at 70±20° C. used as phosphoric acid based etchant.

As a result, the device having a structure shown in FIG. 9 is manufactured.

Figure 1:
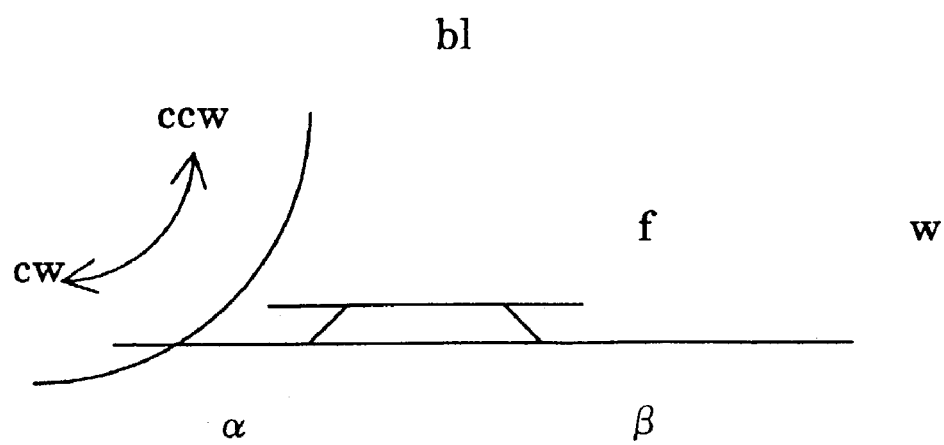
FIG. 1 illustrates a state where a film is formed on a mesa section when a conventional semiconductor wafer is cut and isolated into a plurality of elements by means of dicing.
Figure 2:
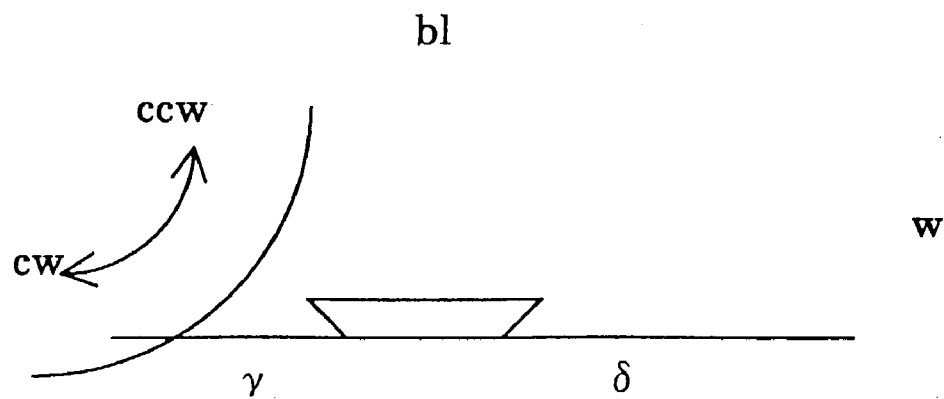
FIG. 2 illustrates a state where no film is formed on a mesa section when a conventional semiconductor wafer is cut and isolated into a plurality of elements by means of dicing.
Figure 3:
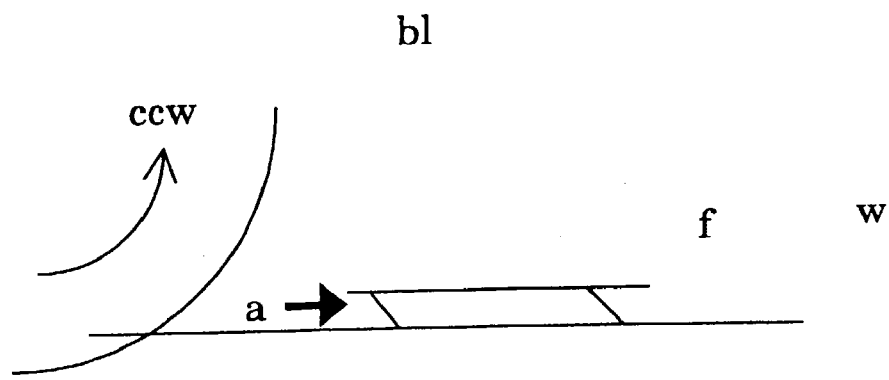
FIG. 3 illustrates a state where a film is formed on a mesa section when a semiconductor wafer according to the present invention is cut and isolated into a plurality of elements by means of dicing.
Figure 4:
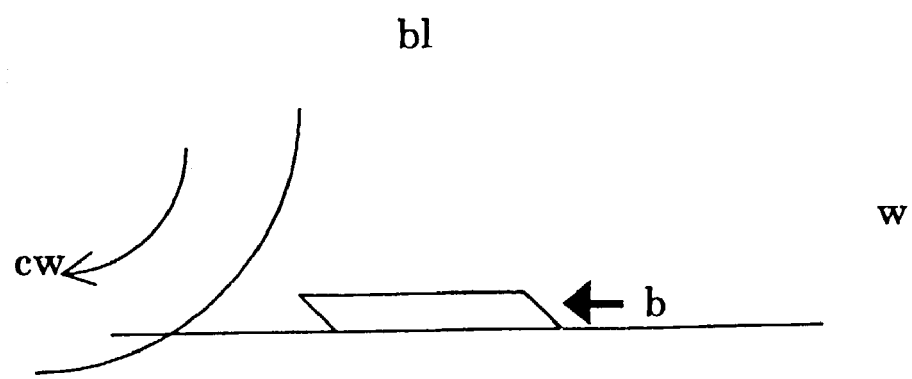
FIG. 4 illustrates a state where a film is formed on a mesa section when a semiconductor wafer according to the present invention is cut and isolated into a plurality of elements by means of dicing.

When the device is isolated into a plurality of elements by a dicing machine, dicing is performed in both X and Y directions so that the coolant accelerated by a dicing blade is not brought into contact with the acute portion between the electrodes and the wafer, as shown in FIGS. 3 and 4. It thereby is possible to isolate the elements while suppressing damage to the electrodes.

Figure 5:
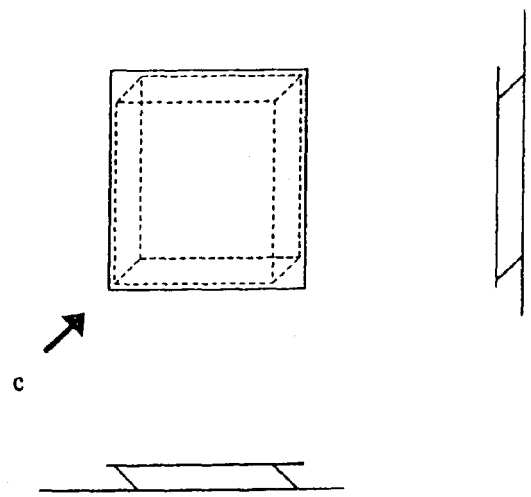
FIG. 5 illustrates a state where a compound semiconductor device according to the present invention is peeled from an adhesive sheet and inverted onto a different adhesive sheet.

Furthermore, when the elements are moved from the adhesive sheet employed in the dicing process to an adhesive sheet for chip shipment after the dicing process, the elements are peeled only from the corner part in which the two forward mesa sections intersect each other as shown in FIG. 5. It is thereby possible to suppress the electrodes from being damaged by the adhesive sheet.

The compound semiconductor device according to the present invention is provided as a mesa shape having the forward mesa surfaces and the backward mesa surfaces formed in the two dicing directions, respectively. It is therefore possible to bring the coolant into contact with the side surfaces of the mesa section only from a direction in which no damage is imparted in the dicing process. In addition, even in the adhesive sheet inversion process, operations can be performed in a direction in which the electrodes are less damaged. It is thereby possible to prevent the respective elements from being damaged by the coolant when cutting and isolating the wafer on the surface of which the mesa section is formed by the dicing. Besides, even in the adhesive sheet inversion process performed after the element isolation by means of dicing, it is possible to prevent the respective elements from being damaged.

According to the manufacturing method of the compound semiconductor device of the present invention, the wafer having a wafer surface substantially parallel to the {100} surface is patterned with at least one of the X direction and the Y direction set substantially parallel to <100> direction. It is thereby possible to lessen damage to the film formed on the mesa section, to perform a highly efficient dicing process and to manufacture a chip having good cut surfaces.

It is also possible to cut and isolate the chip having a thin film overhung above the mesa section, which cannot be conventionally isolated by means of dicing.

Moreover, even when the elements can be cut, depending on dicing conditions but the quality of the blade is sacrificed so as to decrease damage to the elements. According to the manufacturing method of the compound semiconductor device of the present invention, it is unnecessary to sacrifice the quality of the blade. It is therefore possible to improve the quality of the cut surfaces. Accordingly, it is possible to considerably reduce a cutting margin which has been conventionally necessary between the devices to prevent chipping, to make the elements smaller in size and to obtain more elements and to reduce manufacturing cost.

As for handling after the dicing process, it is possible to collectively invert the elements using the sheet, making it possible to considerably decrease the number of manufacturing steps.

Besides, since restrictions on the height of the mesa section which is closely relevant to the overhung quantity of the film can be considerably lightened, it is possible to relax restrictions imposed on the design of the device structure (wafer layer structure).

What is claimed is:

1. A compound semiconductor device comprising:
   a mesa section formed on a wafer, the mesa section having two pairs of parallel exterior side surfaces,
   wherein one pair of the two pairs of parallel exterior side surfaces comprise a first exterior side surface and a second exterior side surface, the first exterior side surface and the second exterior side surface are parallelogramatic, the first exterior side surface being a forward mesa surface having an obtuse tilt angle with respect to the wafer, and the second exterior side surface being a backward mesa surface having an acute tilt angle with respect to the wafer, and wherein the other pair of the two pairs of parallel exterior side surfaces comprise a third exterior side surface and a fourth exterior side surface, the third exterior side surface and the fourth exterior side surface are parallelogramatic, the third exterior side surface being a forward mesa surface having an obtuse tilt angle with respect to the wafer, and the fourth exterior side surface being a backward mesa surface having an acute tilt angle with respect to the wafer.

2. The compound semiconductor device according to claim 1, wherein the device is formed of a material having a Zinc Blend structure.

3. The compound semiconductor device according to claim 1, wherein each surface of said first pair of side surfaces is substantially in a <100> direction and each surface of said other pair of side surfaces is substantially in a <010> direction.

4. The compound semiconductor device according to claim 3, wherein the device has a structure formable by wet-etching at an etching rate of not more than 10 μm/min.

5. The compound semiconductor device according to claim 1, wherein the device has an electrode film on the mesa section that extends to at least one of said forward mesa surfaces.

6. The compound semiconductor device according to claim 1, wherein the device has an AlGaAs layer.

7. The compound semiconductor device according to claim 6, wherein the device has an AlInP layer.

8. The compound semiconductor device according to claim 1, wherein the device has an AlInP layer.

9. The compound semiconductor device according to claim 1, wherein the device has an adhesive sheet on the mesa section.

10. The compound semiconductor device according to claim 9, wherein the device has a film in contact with the adhesive sheet on the mesa section, and the film overhangs and forms an obtuse angle to at least one of said exterior side surfaces.

11. The compound semiconductor device according to claim 1, wherein the device has a film on the mesa section, and the film overhangs and forms an obtuse angle to at least one of said exterior side surfaces.

* * * * *